United States Patent
Morris, III

(10) Patent No.: US 8,115,572 B2
(45) Date of Patent: Feb. 14, 2012

(54) TUNABLE MATCHING NETWORK CIRCUIT TOPOLOGY SELECTION

(75) Inventor: Arthur Sherman Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 172 days.

(21) Appl. No.: 12/429,868

(22) Filed: Apr. 24, 2009

(65) Prior Publication Data

US 2009/0267705 A1    Oct. 29, 2009

Related U.S. Application Data

(60) Provisional application No. 61/047,897, filed on Apr. 25, 2008.

(51) Int. Cl.
    *H03H 7/00* (2006.01)
(52) U.S. Cl. ......... 333/175; 333/174; 333/185; 333/204
(58) Field of Classification Search ............... 333/17.3, 333/32, 33, 175, 174, 185, 204
    See application file for complete search history.

(56) References Cited

U.S. PATENT DOCUMENTS

| | | |
|---|---|---|
| 5,121,078 A | 6/1992 | Havot et al. |
| 5,423,074 A | 6/1995 | Dent |
| 2005/0282503 A1 * | 12/2005 | Onno et al. ............... 455/78 |
| 2007/0194859 A1 | 8/2007 | Brobston et al. |
| 2007/0207748 A1 | 9/2007 | Toncich |
| 2008/0055016 A1 * | 3/2008 | Morris et al. ............ 333/129 |

OTHER PUBLICATIONS

International Search Report mailed Jun 9, 2009, International application No. PCT/US09/41711, International filing date Apr. 24, 2009.

* cited by examiner

*Primary Examiner* — Robert Pascal
*Assistant Examiner* — Kimberly Glenn
(74) *Attorney, Agent, or Firm* — Jenkins, Wilson, Taylor & Hunt, P.A.

(57) ABSTRACT

Tunable matching network topologies are disclosed. A network in accordance with the present invention comprises at least one inductor, and at least one tunable capacitor, in parallel with the inductor, wherein the at least one tunable capacitor tunes the at least one inductor self-resonant frequency.

21 Claims, 16 Drawing Sheets

TUNABLE MATCHING NETWORK CIRCUIT TOPOLOGY SELECTION

CROSS-REFERENCE TO RELATED APPLICATION

This application claims the benefit under 35 U.S.C. Section 119(e) of the following co-pending and commonly-assigned U.S. provisional patent application, which is incorporated by reference herein:

Provisional Application Ser. No. 61/047,897, filed Apr. 25, 2008, by Arthur S. Morris III, entitled "TUNABLE MATCHING NETWORK CIRCUIT TOPOLOGY SELECTION."

BACKGROUND OF THE INVENTION

1. Field of the Invention

The present invention relates generally to actuators used in electronic devices, and in particular to tunable matching networks and the circuit topology for such networks.

2. Description of the Related Art

The theory for fixed matching networks has been developed over many decades with fundamental work summarized in *Microwave Filters, Impedance-Matching Networks, and Coupling Structures* by Matthaei, Young, and Jones.

However, the literature for matching networks that utilize tunable components for matching variable loads and/or optimizing performance at multiple frequencies is not well developed. The fixed network theory focuses on the required matching bandwidth and losses within the network. These requirements can be adapted for the tunable case by only requiring the instantaneous bandwidth at a given operating channel set. To minimize the size and loss of the network, it is preferable to use the minimum number of components. To maximize the upper frequency limit and minimize the product size, it is strongly preferred to use smaller capacitor and inductor element values. Tunable matching networks also require minimizing the insertion loss in the case of the well-matched load. The combination of matching improvements and circuit losses can best be characterized by the transducer gain achievable into the specified load.

Tunable matching networks are useable in cellular telephone handsets, specifically for handset antenna applications. The top-level constraints for matching topology selection are performance, cost and size. Key technology contributors to performance that interact with the topology selection include tunable element ratios (ratio between maximum and minimum values achievable by the element), tunable element parasitics (non-ideal element behavior), tunable element density (reactance per volume), tunable element Q (ratio of reactive power storage to power loss), package dielectric constant, package height, package metal conductivity, package metal thickness, package metal surface finish and package design rules.

It can be seen, then, that there is a need in the art for performance criteria for tunable matching networks. It can also be seen that there is a need in the art to apply the performance criteria to specific topologies to determine the proper topology for a given application of the tunable matching network constrained by a given set of element and package technologies.

SUMMARY OF THE INVENTION

To minimize the limitations in the prior art, and to minimize other limitations that will become apparent upon reading and understanding the present specification, the present invention discloses tunable matching network topologies.

A network in accordance with one or more embodiments of the present invention comprises at least one inductor, and at least one tunable capacitor, in parallel with the inductor, wherein the at least one tunable capacitor tunes the at least one inductor self-resonant frequency.

Such a network further optionally comprises the tunable matching network being a bypassed-double pi network, the bypassed-double pi network having a single variable capacitor in parallel with the at least one tunable inductor, a capacitive allocation to the at least one tunable capacitor being selected to maximize a frequency response of the tunable network such that the tunable network has a maximum tunability at a lowest frequency of interest, a capacitive allocation to the at least one tunable capacitor being selected to maximize a frequency response of the tunable network such that the tunable network achieves maximum transparency at a highest frequency of interest, the tunable network being used in a cellular telephone system, and a capacitive allocation to the at least one tunable capacitor being selected to maximize a frequency response of the tunable network such that reactive matching at a lowest frequency of interest and transparency at a highest frequency of interest are achieved by the tunable network.

Such a network further optionally comprises the tunable matching network being a bypassed-double pi network, the bypassed-double pi network having a single variable capacitor in parallel with the at least two-part inductor. The response of the tunable matching network is desired to provide large impedance variation at all angles across a range of frequencies of interest. One of the tuning states must approach ideal zero-loss transparency when the system does not require tuning. In achieving this breadth of function, two specific areas provide the greatest design challenges. The response of the tunable matching network must provide maximum tunability at a lowest frequency of interest which requires relatively large values of inductors and capacitors while also providing maximum transparency at a highest frequency of interest which requires relatively small values of inductors and capacitors.

The tunable matching network can be used in a cellular telephone system, and a frequency response of the tunable matching network being designed to achieve both wide tunability and high transparency at all frequencies of interest.

Another network in accordance with one or more embodiments of the present invention comprises a first inductor coupled to a first port and a first node, a second inductor, coupled between the first node and a second node, a first capacitor, coupled between the first node and a ground node, a second capacitor, coupled between the second node and the ground node, a third inductor, coupled between the second node and a third node, a third capacitor, coupled between the third node and the ground node, a fourth inductor, coupled between the third node and a second port, and a fourth capacitor, coupled between the first node and the third node, wherein the fourth capacitor is a variable capacitor, wherein the fourth capacitor tunes a self-resonant frequency of the series combination of second and third inductors. The first and fourth inductors may be realized by the inductance of feed interconnects within a package.

Such a network further optionally comprises the second and third inductors being individually tunable with a fifth tunable capacitor connected between first and second nodes and a sixth capacitor connected between second and third nodes, a frequency response of the tunable matching network being maximized for tunability at a lowest frequency of interest, a frequency response of the tunable matching network being maximized to achieve maximum transparency at a highest frequency of interest, the tunable matching network being used in a cellular telephone system, and a frequency response of the tunable matching network being designed to achieve tunability at a lowest frequency of interest and achieve transparency at a highest frequency of interest.

A tunable network in accordance with one or more embodiments of the present invention comprises a first inductor, a second inductor, and a third inductor, wherein the first inductor, second inductor, and third inductor are connected in series, a first capacitor, coupled between a series connection of the first inductor and the second inductor and ground, a second capacitor, coupled between a series connection of the second inductor and the third inductor and ground, and a third capacitor, in parallel with the second inductor, wherein the third capacitor tunes a self-resonant frequency of the second inductor.

Such a network further optionally includes a fourth inductor connected in series with the third inductor, a fourth capacitor coupled between a series connection of the third inductor and the fourth inductor and ground, and a fifth capacitor, coupled in parallel with the third capacitor, wherein the fifth capacitor tunes a self-resonant frequency of the third inductor, a sixth capacitor, coupled in parallel with the third capacitor and the fifth capacitor, the third capacitor and the fifth capacitor being a single capacitor coupled in parallel with the combination of the second inductor and the third inductor, a frequency response of the tunable network being maximized for tunability at a lowest frequency of interest, a frequency response of the tunable network being maximized to achieve maximum transparency at a highest frequency of interest, and a frequency response of the tunable network being designed to achieve reactive matching at a lowest frequency of interest and achieve transparency at a highest frequency of interest.

Other features and advantages are inherent in the system disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Design Considerations

Tunable matching circuits need specific circuit configurations to enable high performance. For well-matched loads, they must be maximally transparent with minimum absorption and reflection. For poorly-matched loads, they should substantially improve the power transfer to the load. For a matching network to work well over a range of frequencies approaching, through and beyond an octave of bandwidth brings substantial challenges. Simultaneously matching at two frequencies (such as a transmit/receive pair) add further challenges. This invention discloses a circuit topology class that addresses all of these performance challenges.

The two extremes of performance are to achieve large tunability at the lowest frequency of interest where large capacitor and inductor values are necessary, and achieving high transparency at the highest frequency of interest where a low-loss transmission line should be formed. A key challenge is forming inductors of sufficient inductance to enable the low frequency tuning while keeping the inductor self resonant frequency well beyond the highest frequencies.

Figure 1:
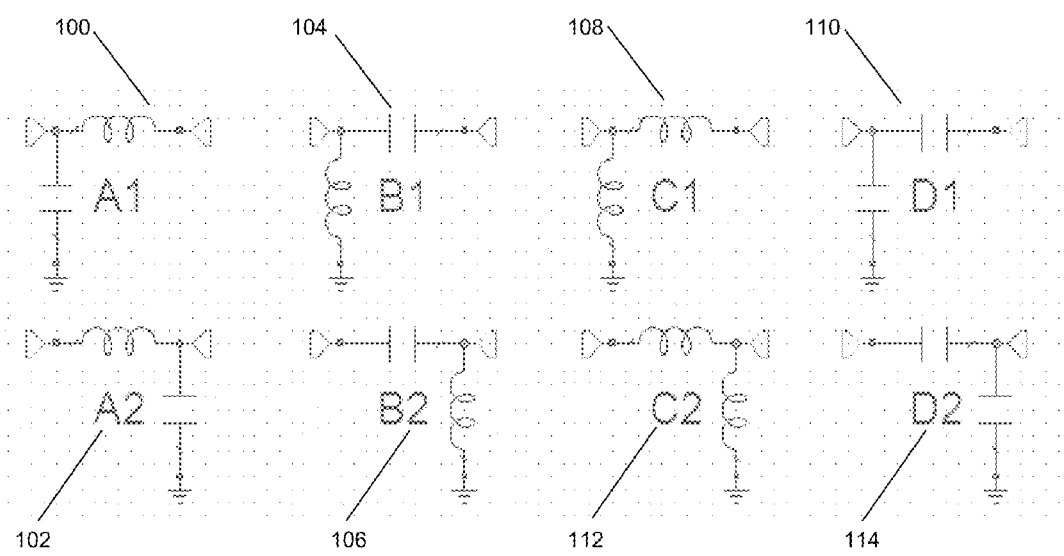
FIG. 1 illustrates series-shunt combinations of lumped reactive elements.

FIG. 1 illustrates series-shunt combinations of lumped reactive elements.

The most fundamental matching circuits are "L" sections, utilizing a series-shunt combination of two lumped reactive elements, e.g., an inductor and a capacitor. There are 8 basic element combinations of lumped elements that can be used to form these "L" sections, and each of these is able to match a subset of possible load impedances. Sections 100-114 illustrate the eight possible combinations of elements.

Figure 2:
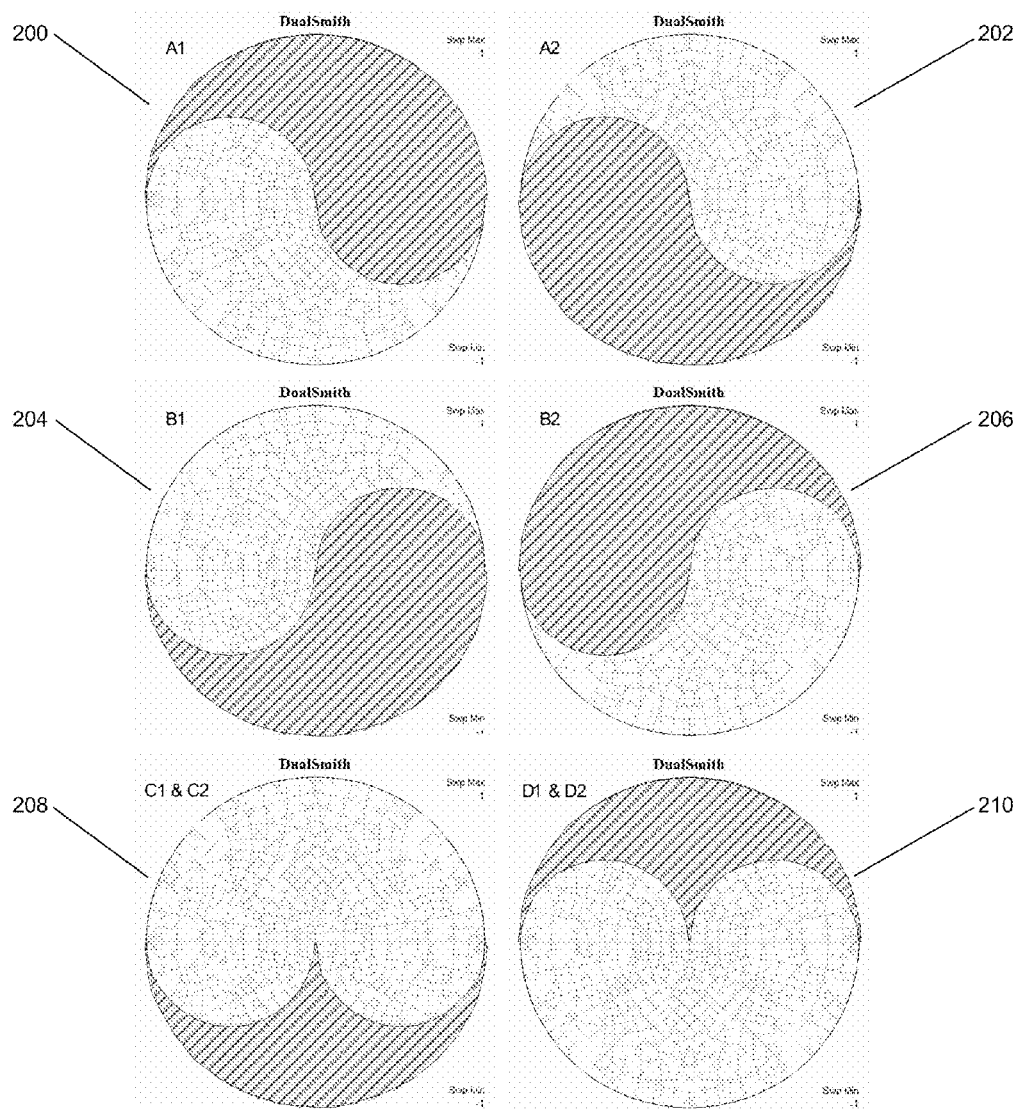
FIG. 2 illustrates Smith Charts corresponding to the fundamental matching circuits of FIG. 1, and FIGS. 3 and 4 illustrate Dual Smith Charts for combinations of sections described in FIGS. 1 and 2.

FIG. 2 illustrates Smith Charts showing impedances achievable by each of the corresponding fundamental matching circuits of FIG. 1. So, for example, section 100 has a matching coverage shown in graph 200 in the shaded region. Section 102 has a matching coverage shown in graph 202 in the shaded region, section 104 has a matching coverage shown in graph 204 in the shaded region, section 106 has a matching coverage shown in graph 206 in the shaded region, sections 108 and 112 have a matching coverage shown in graph 208 in the shaded region, and sections 110 and 114 have a matching coverage shown in graph 210 in the shaded region.

Graphs 208 and 210 show that when both lumped passives are of one type (C1, C2, D1, D2), a significantly smaller fraction of possible impedances can be matched.

When either the in-line combination of sections 100 and 102 or the in-line combination of sections 104 and 106 are used together, the entire range of impedances can be matched, as can be seen by combining the coverage areas of graphs 200 and 202 or graphs 204 and 206, respectively.

Figure 3:
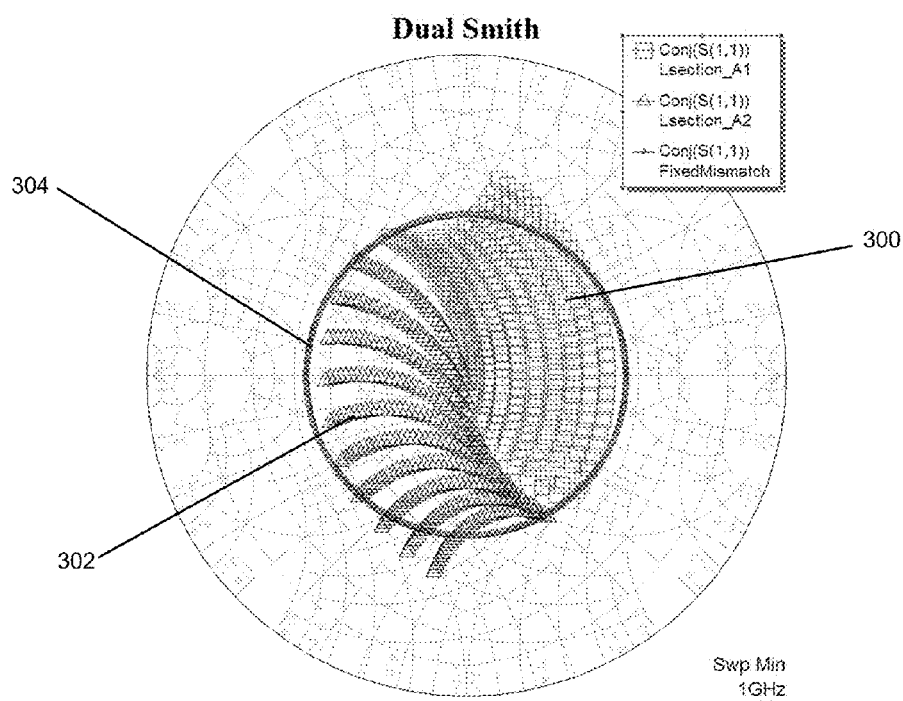
Figure 4:
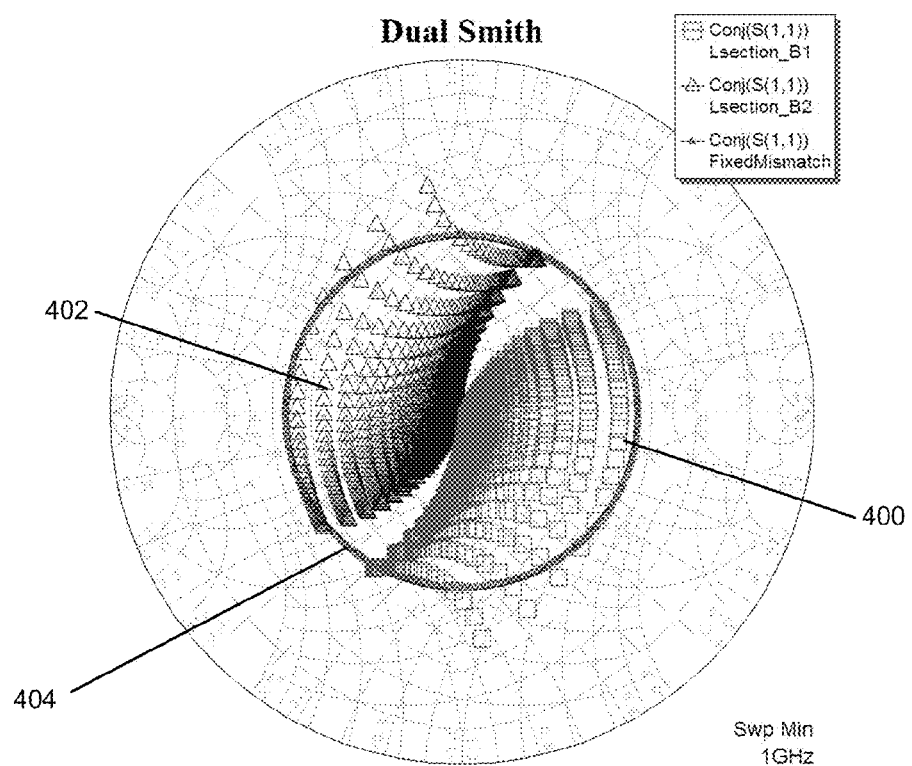

FIG. 3 illustrates coverage of the Smith Chart for a specific element tuning range for the in-line combinations of sections 100 and 102 described in FIG. 1 to achieve impedance coverage with reflection coefficients of all angles and to a maximum magnitude. The maximum magnitude is set by the range of element tunability. In FIGS. 2, 3, and 4 both inductors and capacitors were assumed ideal and widely tunable. FIG. 4 illustrates similar coverage of the Smith Chart for a specific element tuning range for the in-line combinations of sections 104 and 106 described in FIG. 1. Note that FIG. 3 provides a more seamless coverage along the boundary between coverage provided by each section.

The next consideration is the range of element values required to realize sufficient matching impedance coverage. The values are determined by the maximum Voltage Standing Wave Ratio (VSWR) that must be matched perfectly, and the frequency of operation of the circuit. FIG. 3 illustrates the range of matching impedances for operation at 1.0 GHz, using a combination of sections 100 and 102, (the two low-pass L sections) with a VSWR=3 tuning capability. Squares 300 are those impedances matched through the use of section 100, and triangles 302 are those impedances matched through the use of section 102. Circle 304 is the 3:1 limit. These results are obtained for L networks with inductance values from 1 to 10 nH in 1 nH steps and capacitance values from 0.25 to 4.0 pF in 0.125 pF steps.

Similarly, FIG. 4 illustrates the two high-pass sections, sections 104 and 106, for the same coverage. Squares 400 illustrate the matches provided by section 104, and triangles 402 illustrate the matches provided by section 106. Again, circle 404 illustrates the 3:1 limit. The high-pass circuit requires shunt inductance values of 6 to 40 nH in increments of 1 nH and series capacitance values of 2.5 to 20 pF in increments of 0.5 pF. Even higher values of inductance would be required to fill in the gaps shown inside of circle 404 between the matching points provided by circuits 104 and 106.

As seen in FIGS. 3 and 4, the low-pass networks 100 and 102 provide a better range of performance from transparency for a well-matched load to tuning higher VSWRs with significantly smaller passive values than the high-pass networks 104 and 106. Thus, the low-pass networks 100 and 102 are strongly preferred among the L-sections. If the networks are used at lower frequencies, inversely proportional larger elements will be required to achieve the same performance. Conversely, in the alternative case where the expected loads are all at high VSWR, it is likely that the high-pass networks 104 and 106 would be preferable.

Practical Implementation

To implement both sections 100 and 102 in a single network requires either switches or high ratio tunable elements. Given that high ratio elements are required to implement either one individually, the optimum solution is to use high-ratio elements to implement the combination. This combination can be achieved in either PI or T combinations of the L-sections.

To implement either network, a tunable inductor is needed. Wide ratio inductors are not currently available. Thus, the present invention implements a wide-ratio tunable inductor by tuning a capacitor in parallel with the inductor, which tunes the inductor self-resonant frequency. As the self-resonant frequency is lowered, the effective inductance is increased. This can be accomplished with a physically separate variable capacitor element or could be implemented by directly tuning the parasitic capacitances of the inductor by changing turn spacing or spacing from the inductor to ground.

As the inductors are physically larger than the capacitors, and the capacitors are required for tuning purposes, the PI network is preferred compared to the T-network to create the combination of sections 100 and 102, as the PI network requires only a single tunable inductor. Another factor is that the combination into a PI network enables the matched condition to be reached with a smaller range of element values.

Losses

In addition to matching, losses in the matching network must be considered. More precisely, the function of the matching network is the maximization of the transducer gain into the specified load impedance. Both incomplete matching and absorption losses will degrade this performance. Thus, all elements in the network must be low-loss. The specific loss requirements will depend on the application but inductor and capacitor Q values in excess of 50 are likely required. Q values>100 will bring additional value.

Parasitics

The above analysis treated the reactive elements in the network as the primary design elements. However, each lumped element and the connections between each element also have parasitic reactances that modify the response of the network. These parasitic reactances include capacitance to ground for the inductor tuning capacitor, inductor inter-turn capacitance, inductor capacitance to ground, capacitor parasitic capacitance to ground and series inductance in the capacitors. These fixed parasitic values limit the tuning capabilities of the network. These parasitics must be minimized to maximize the performance and tuning range of the network.

Results and Contrasts

For each network, the performance for the highest frequency loss for the well-matched case and the reflection performance for the poor VSWR case at the lowest frequency are examined hereinbelow. As concrete examples, for the low frequency case, we examine the lower frequency end of the US cellular band (~820 MHz), and for the high frequency case, we utilize the upper end of the UMTS band (~2200 MHz). The following plots illustrate the behavior of each network topology for typical element values and capacitor parasitic values. For ease of analysis, design values of 20 pF of available tunable capacitance, 0.16 pF of capacitive parasitics to ground per capacitor pin for each 1 pF of capacitance, intrinsic capacitor ratios of 20:1, and 1 nH of feed inductance at input and output were used. Other values may be used without departing from the scope of the present invention.

Single PI Network

Figure 5:
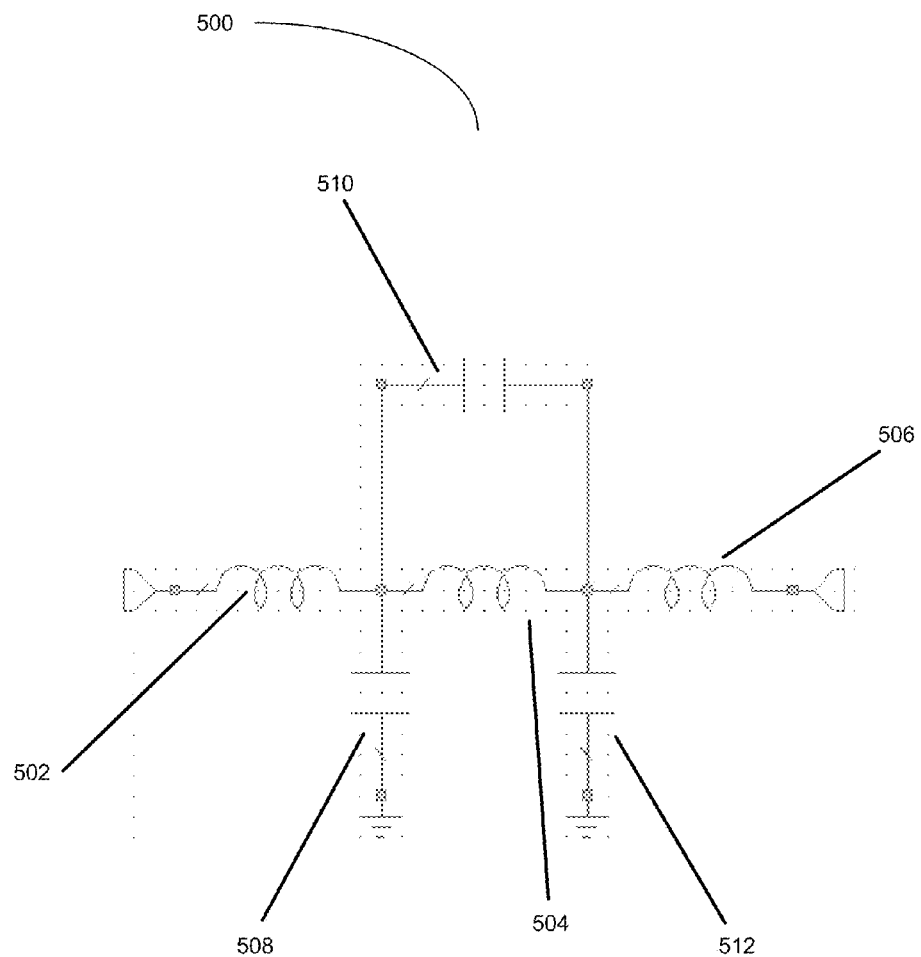
FIG. 5 illustrates a single section pi network in accordance with the present invention.

FIG. 5 illustrates a single section pi network in accordance with the present invention.

Figure 6:
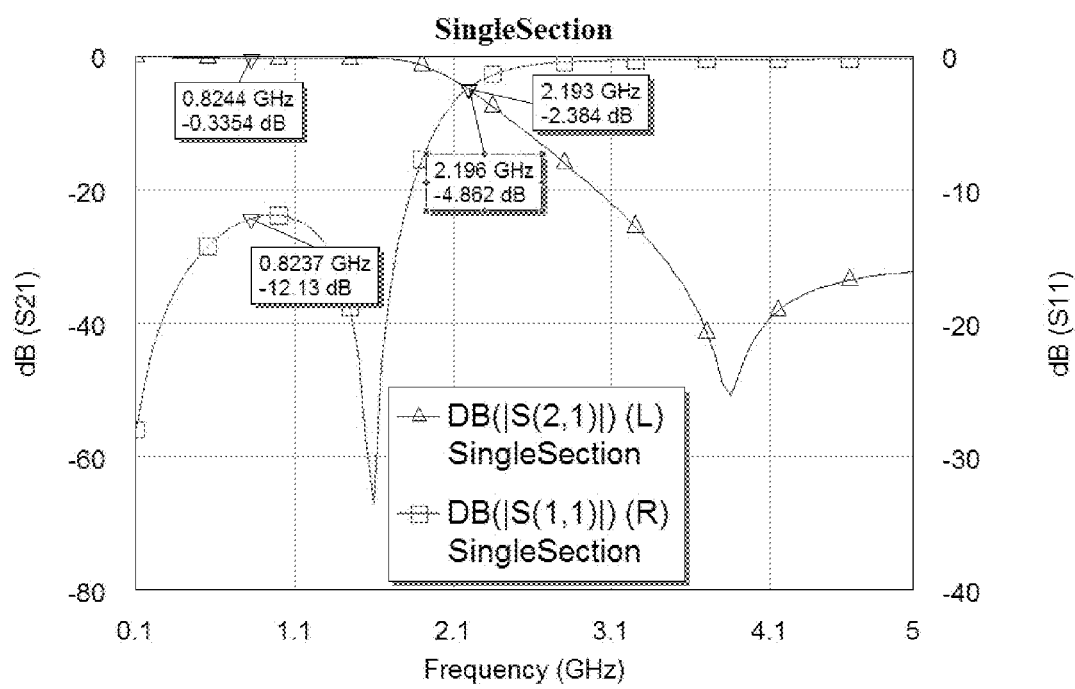
FIGS. 6 and 7 illustrate the response of the single pi network of FIG. 5 for high-frequency transparency and low-frequency tuning settings, respectively.

For the single section Pi network 500, an inductance value of 4.3 nH for each of inductors 502-506 and a 6-8-6 pF tunable capacitor configuration for capacitors 508-512 is used, where capacitor 510 is an 8 pF capacitor. For this network, setting the capacitor 508-512 values to minimums yield the high-frequency transparent setting, shown in FIG. 6. Note that the high frequency transparent setting has rolled off significantly at 2.2 GHz due to parasitics. In essence, FIG. 5 can be considered either as a single-pi tunable network with input/output fixed feed inductors 502 and 506, or as a double-T with only the center inductor 504 as a tunable element.

Figure 7:
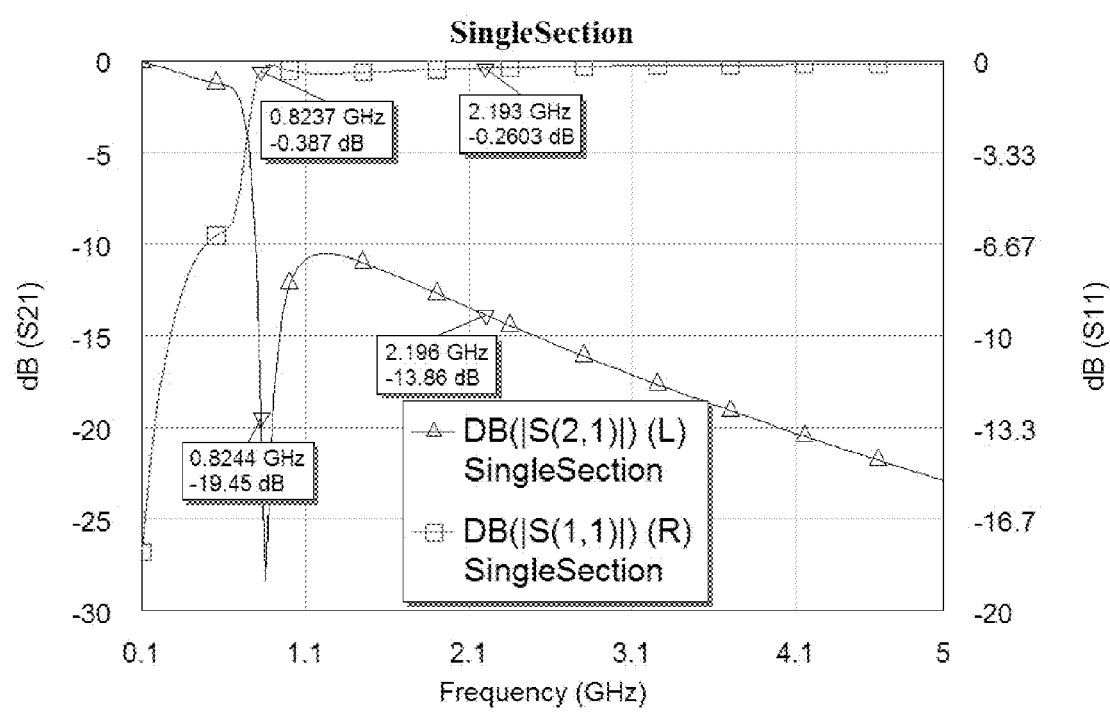

FIG. 7 illustrates the response of the single pi network 500 of FIG. 5 set for low-frequency tuning. Note that the values of the elements cannot be reduced to reduce the associated parasitics to improve the high-frequency response since the low-frequency tuning is already marginal. Variations in the inductance value and tunable capacitance allocation may be used to improve either the low or high frequency responses but only to the detriment of the other.

Double PI Network

Figure 8:
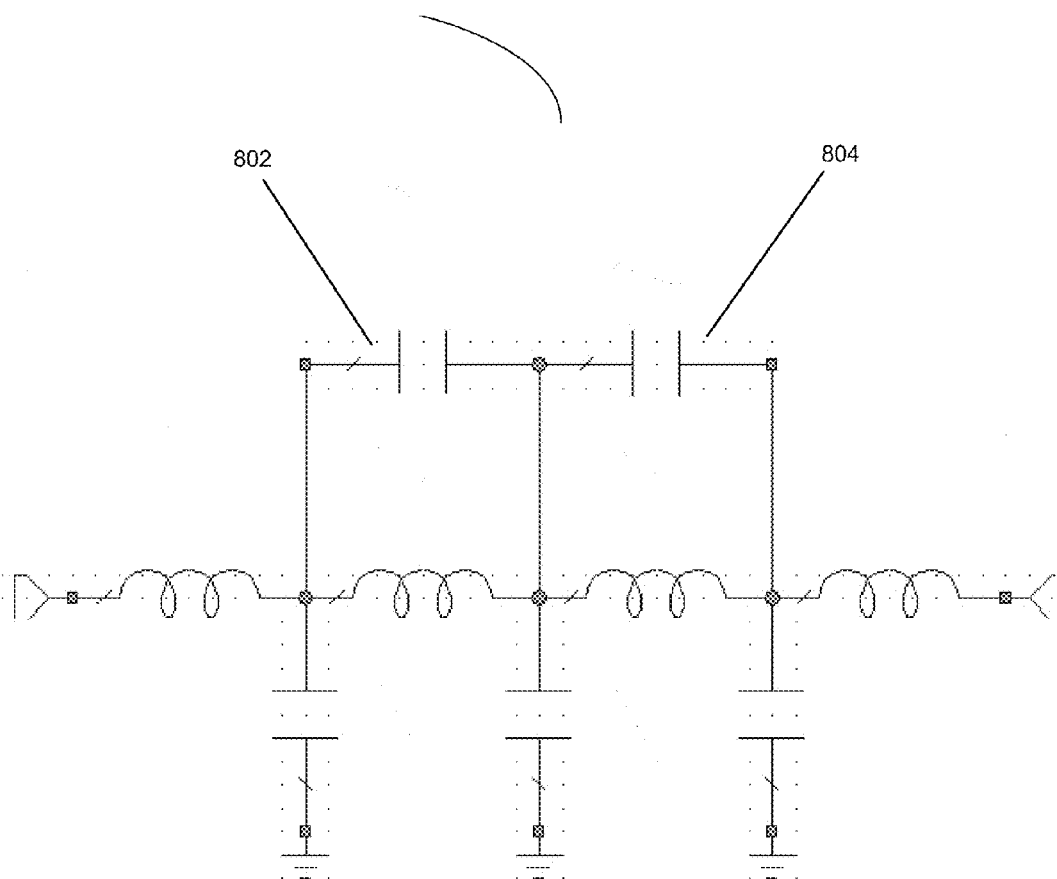
FIG. 8 illustrates a double-pi network in accordance with the present invention.

FIG. 8 illustrates a double-pi network in accordance with the present invention.

Figure 9:
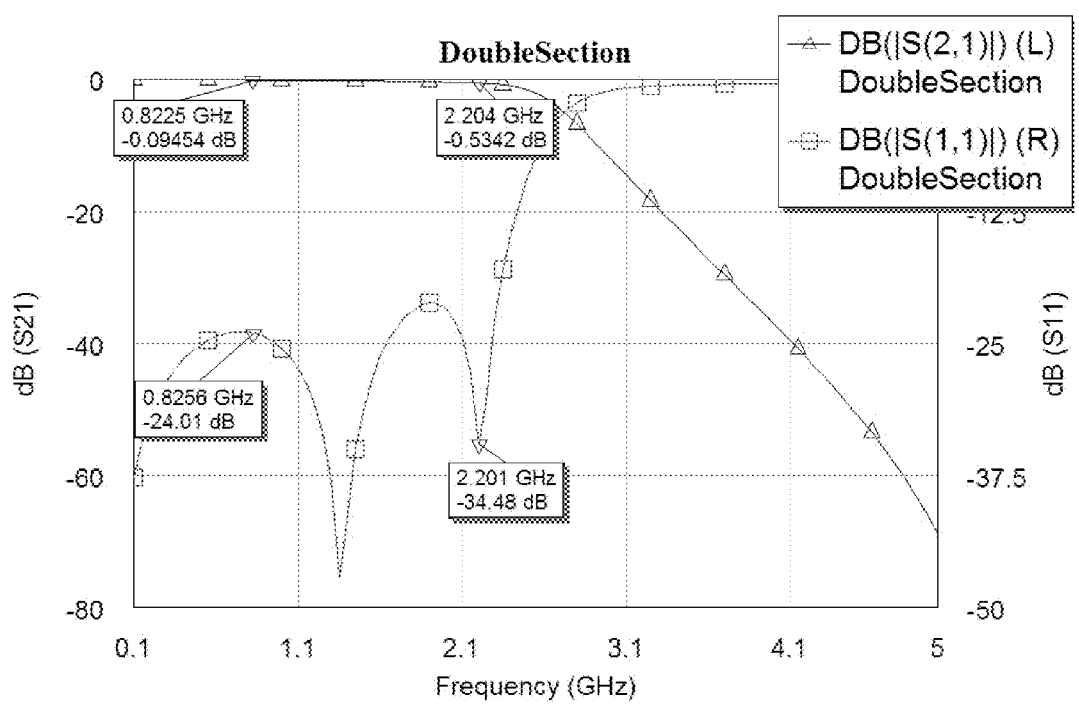
FIGS. 9-10 illustrate the response for the double-pi network of FIG. 8 for high-frequency transparency and low-frequency tuning settings, respectively.

The double PI network 800 is two single PIs connected in series. Thus the shared central capacitor, i.e., the combination of capacitors 802 and 804, effectively doubles the capacitance across the inductors. If we use the same basic values as in the single PI, with each inductance=4.3 nH, series tunable capacitances of 4 pF and shunt tunable capacitance per PI of 4 pF, the network may be described as a 4-4-4-4-4 configuration. When this is set for high-frequency transparency, the frequency response shown in FIG. 9 is obtained. Note that the high frequency roll-off occurs just above the IMT2000 band. Although twice the total inductance is present in the circuit, the parasitic effects are much less due to the smaller capacitive loading on each inductor.

Figure 10:
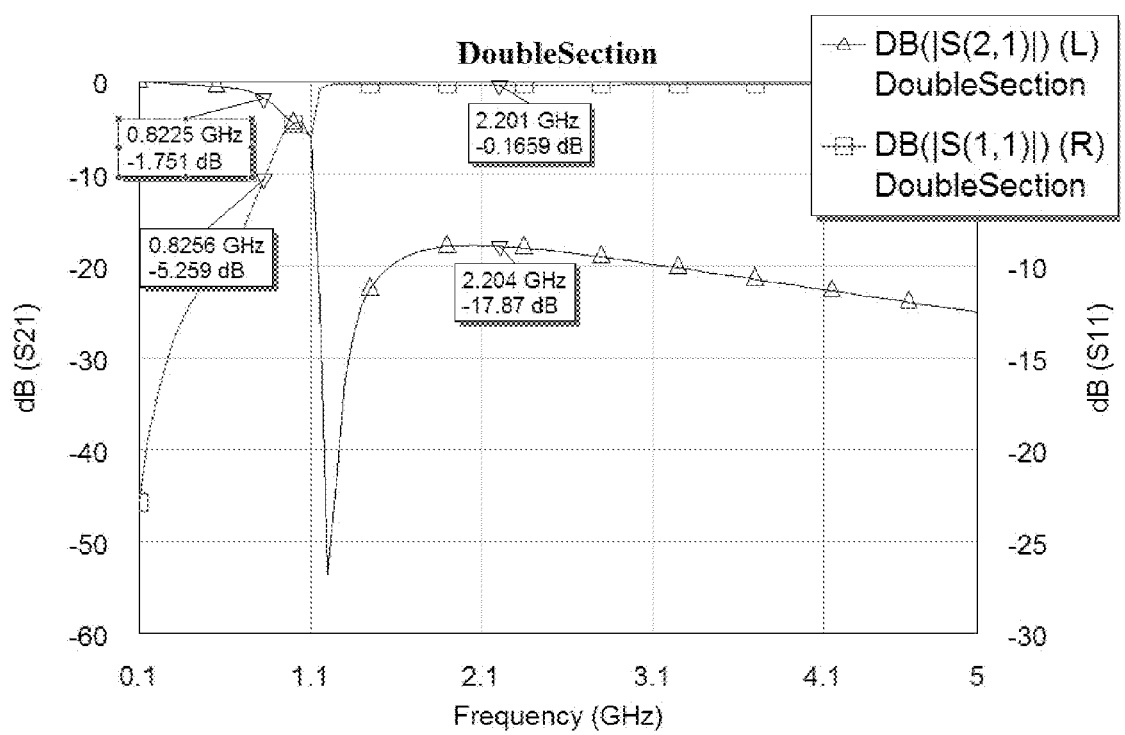

If the strongly tuned case for U.S. cellular frequencies is tested, with the two series capacitors 802 and 804 at maximum and one of the end shunt capacitors at maximum, the frequency response is as shown in FIG. 10. Note that strong tuning can not be achieved at the bottom of US cellular frequencies, as each section does not have enough capacitance to pull the inductor resonance frequency down far enough to provide sufficient tuning. This could be improved by adding more tunable capacitance but this would directly impact the die cost and would add more parasitics that would unacceptably degrade the marginal high frequency performance. Also, note that this approach requires twice the inductance in the same package as the single section and may lead to unintended coupling as well as unacceptable size and cost.

Double Pi Network with Bypass

Figure 11:
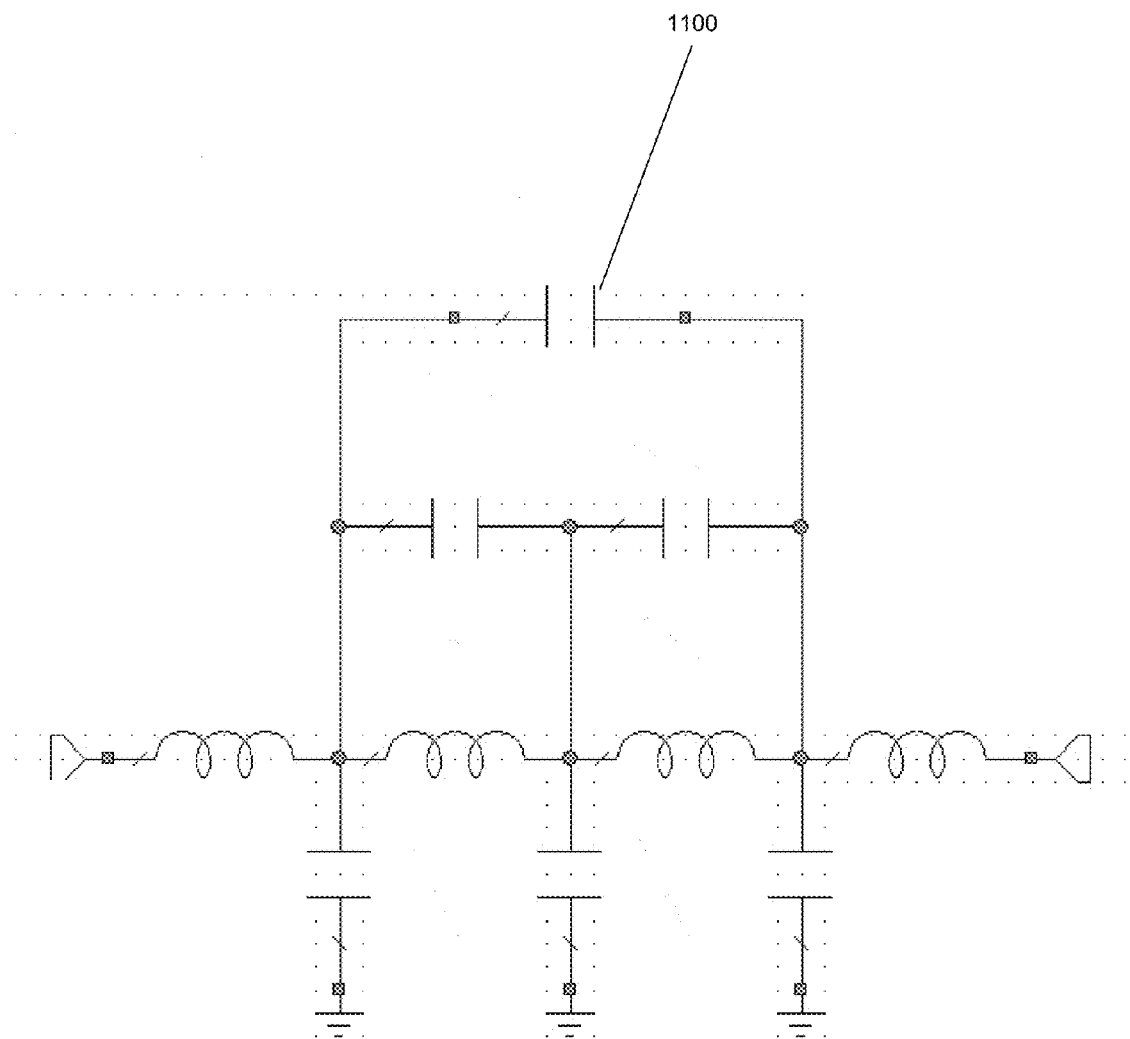
FIG. 11 illustrates a double-pi network with bypass capacitor in accordance with the present invention.
Figure 12:
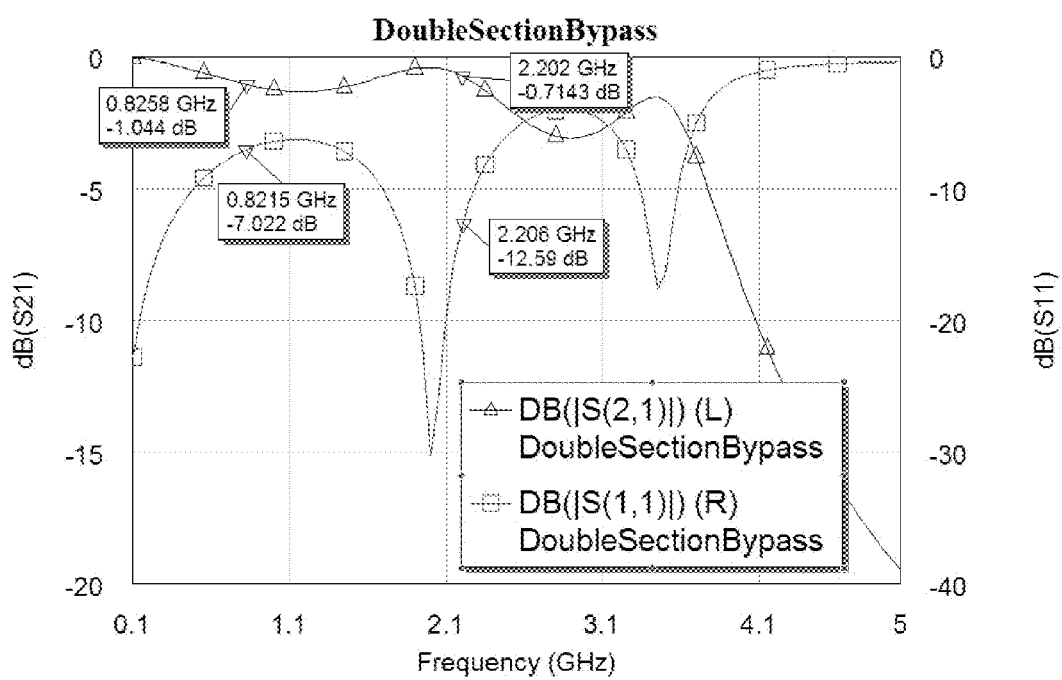
FIGS. 12-13 illustrate the response for the bypassed double-pi network of FIG. 11 for high-frequency transparency and low-frequency tuning settings, respectively.

An approach to reduce the two series capacitor parasitics and make better use of their tuning capability is to add a tuning capacitor 1100 that connects across both inductors as shown in FIG. 11 in the double-pi bypass topology. This capacitor tunes the series combination of the two inductors and thus is able to achieve larger tunings for the same variable capacitance. If we consider such a network using only 2.15 nH per inductor (i.e. the series combination is the same as the single pi network) and a capacitor distribution of 4-2-2-2-4_6 (4 pF each for the two end shunt capacitors, 2 pF each for the center shunt capacitor and the two capacitor connected directly in parallel with the inductors and 6 pF connected across both inductors), we obtain the response shown in FIG. 12 for the high-frequency transparent case. Note that the response is far more broadband than in the previous circuits.

The tuning for this transparent setting has the center shunt capacitor tuned to a non-zero values that compensates for the parasitic loading of the other capacitors at the end nodes to form a more uniform transmission line. In the previous cases, the most transparent setting was for all tunable capacitors to be set to minimum. Thus, in addition to performance, this approach brings in a level of flexibility not seen in the previous topologies.

Figure 13:
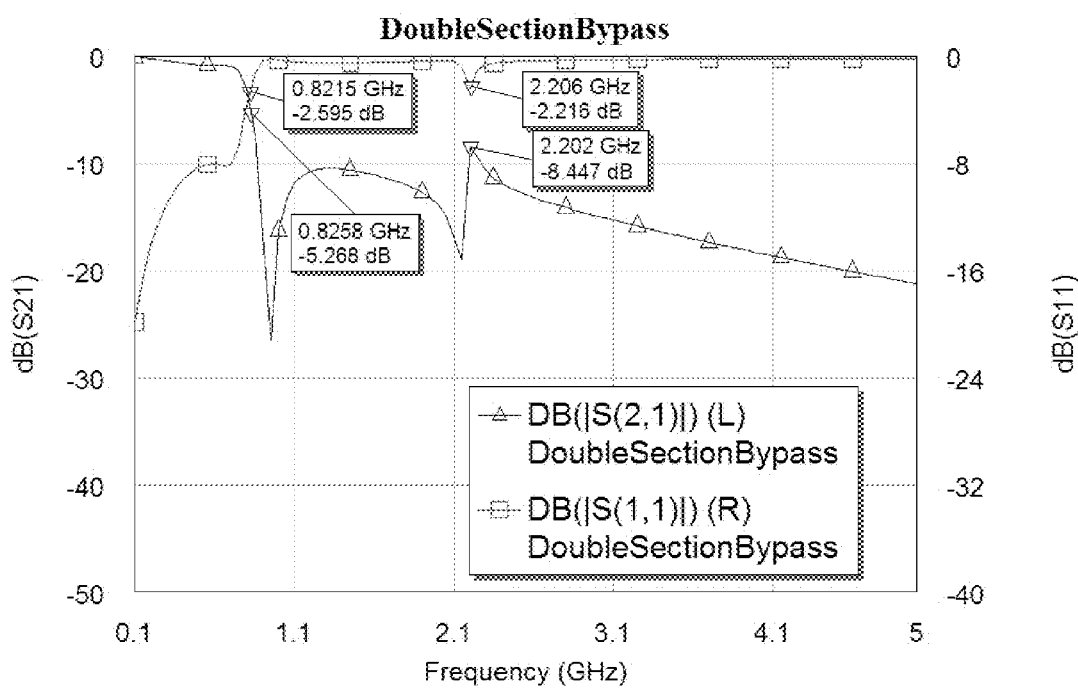

When set for maximum tuning at the low frequencies, the frequency response of the circuit is given in FIG. 13. Note that the available tuning is insufficient, and that a spurious higher frequency response is also present. However, if we use the margin obtained at the high frequency setting to improve the low frequency response, it is apparent that either more capacitance is required (with added cost and size) or some of the element may approach zero. This leads us to the final circuit.

Combined Capacitor Approach

Figure 14:
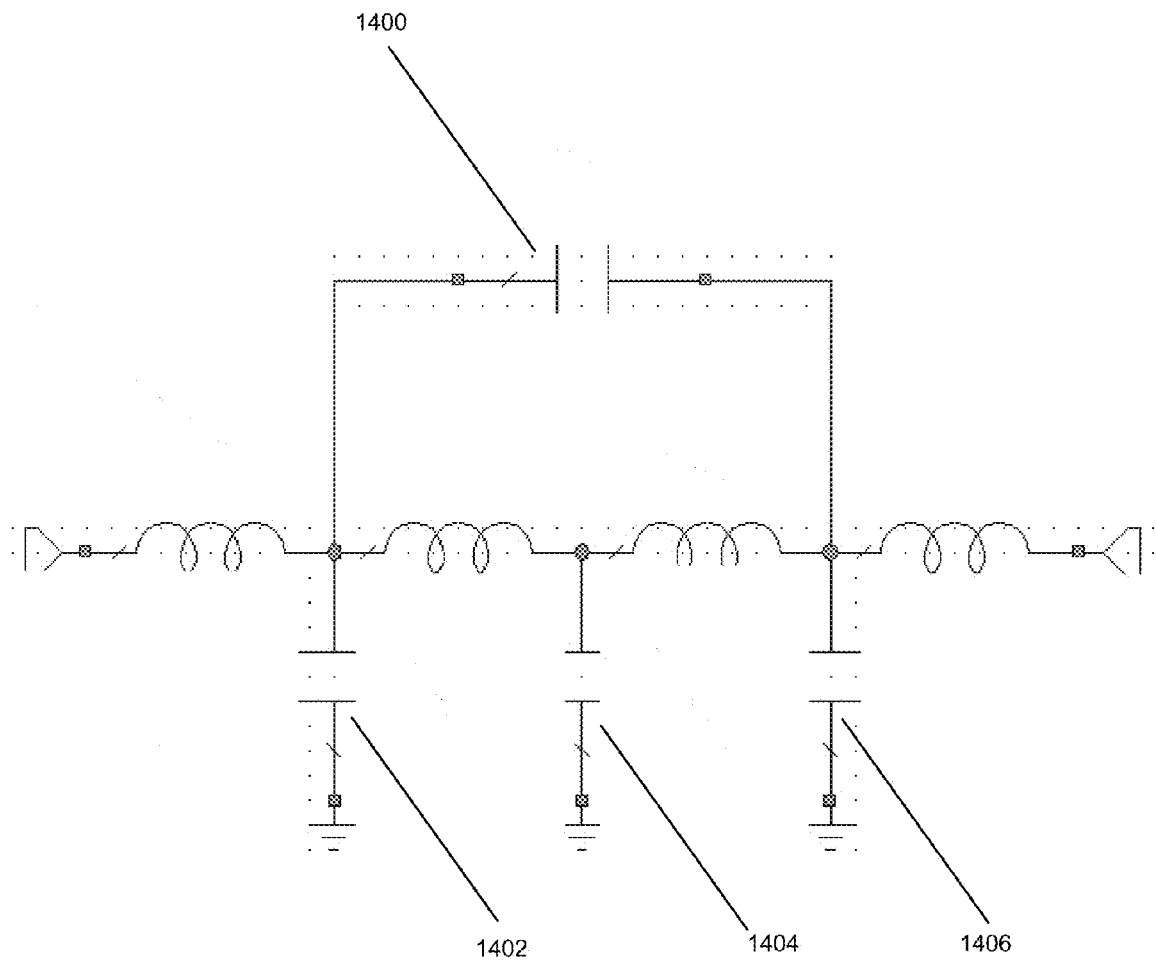
FIG. 14 illustrates a lumped LC transmission line with a single series tunable capacitor in accordance with the present invention.

FIG. 14 illustrates a lumped LC transmission line with a single series capacitor in parallel with the series combination of two inductors in accordance with the present invention.

Figure 15:
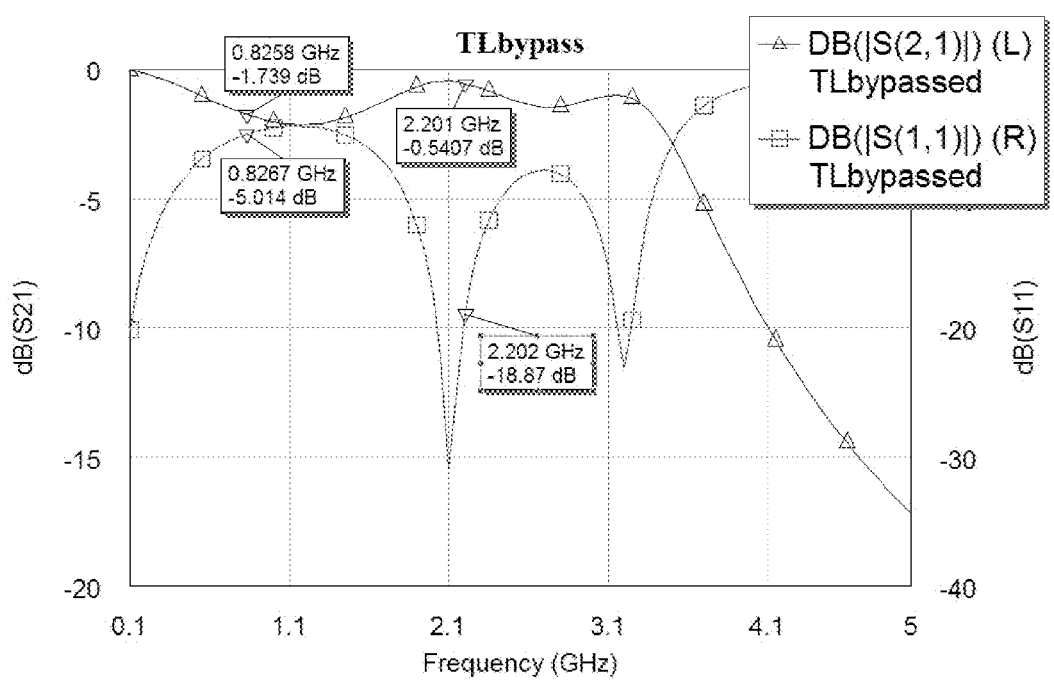
FIGS. 15-16 illustrate the response for the network of FIG. 14 for high-frequency transparency and low-frequency tuning settings, respectively.

FIG. 14 shows the capacitors across each inductor being combined into a single capacitor to tune the entire inductor structure. This forms a distributed LC transmission line with variable capacitive shunt loads and a bypass capacitor from input to output. For the specific example, the two inductors are 2.15 nH as above and the capacitors are distributed as 4-0-4-0-4-8 using the same coding as above, where capacitor 1400 is an 8 pF capacitor, and capacitors 1402-1406 are 4 pF capacitors. When this is set to the transparent case, the frequency response is shown in FIG. 15.

Note that this response is similar to the bypassed double pi with significant frequency margin but with even lower loss. This is due to the improvement of the center tunable shunt capacitor as there are less parasitics at the center node due to the removal of the series capacitor connections in previous configurations and thus frees up availability of capacitance that can be allocated as shunt capacitance for tuning.

Figure 16:
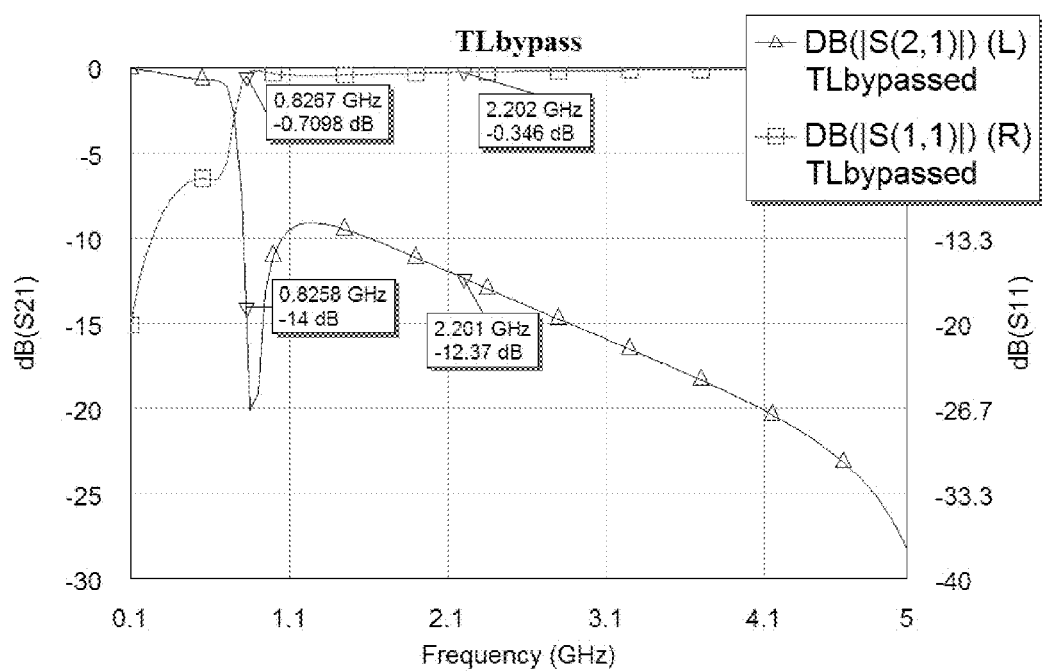

The maximally tuned frequency response is shown in FIG. 16, where highly reactive behavior at the lower frequencies is exhibited. Thus the bypassed configuration provides the optimum combination of high frequency transparency and low frequency tuning and the highest performance of all the topologies.

The present invention can be extended to an N-pi topology, where the single series tuning capacitor is in parallel with a series combination of N sections, each with a series inductor and a shunt tunable capacitor. The key to such a larger topology is to have the total inductance add up to the proper value for the low frequency response, and, for a given high-frequency response, the larger number of sections, each section with a fraction of the total inductance, will further improve the high-frequency response of the topology, although at the expense of a more complicated circuit and larger cost. Further, the inductors may be magnetically coupled within the circuit such that individual inductors in the circuit can be a single coil divided by taps, or separate structures, as desired.

SUMMARY

Tunable matching network topologies are disclosed. A network in accordance with one or more embodiments of the present invention comprises at least one tunable inductor, and at least one tunable capacitor, in parallel with the inductor, wherein the at least one tunable capacitor tunes the at least one tunable inductor self-resonant frequency.

Such a network further optionally comprises the tunable matching network being a bypassed-double pi network, the bypassed-double pi network having a single variable capacitor in parallel with the at least one tunable inductor, the tunable network being used in a cellular telephone system, and a capacitive allocation to the at least one tunable capacitor and the inductor value are selected such that the tunable network has maximized tunability at a lowest frequency of interest and maximized transparency at a highest frequency of interest for respective tuning settings.

Another network in accordance with one or more embodiments of the present invention comprises a first inductor coupled to a first port and a first node, a second inductor, coupled between the first node and a second node, a first capacitor, coupled between the first node and a ground node, a second capacitor, coupled between the second node and the ground node, a third inductor, coupled between the second node and a third node, a third capacitor, coupled between the third node and the ground node, a fourth inductor, coupled between the third node and a second port, and a fourth capacitor, coupled between the first node and the third node, wherein the fourth capacitor is a variable capacitor, wherein the fourth capacitor tunes a self-resonant frequency of the second inductor.

Such a network further optionally comprises the second inductor being a variable inductor, the tunable matching network is used in a cellular telephone system, and a capacitive allocation to the at least one tunable capacitor and the inductor value are selected such that the tunable network has maximized tunability at a lowest frequency of interest and maximized transparency at a highest frequency of interest for respective tuning settings.

A tunable network in accordance with one or more embodiments of the present invention comprises a first inductor, a second inductor, and a third inductor, wherein the first inductor, second inductor, and third inductor are connected in series, a first capacitor, coupled between a series connection of the first inductor and the second inductor and ground, a second capacitor, coupled between a series connection of the second inductor and the third inductor and ground, and a third capacitor, in parallel with the second inductor, wherein the third capacitor tunes a self-resonant frequency of the second inductor.

Such a network further optionally includes a fourth inductor connected in series with the third inductor, a fourth capacitor coupled between a series connection of the third inductor and the fourth inductor and ground, and a fifth capacitor, coupled in parallel with the third capacitor, wherein the fifth capacitor tunes a self-resonant frequency of the third inductor, a sixth capacitor, coupled in parallel with the third capacitor and the fifth capacitor, the third capacitor and the fifth capacitor being a single capacitor coupled in parallel with the combination of the second inductor and the third inductor, and a capacitive allocation to the at least one tunable capacitor and the inductor value are selected such that the tunable network has maximized tunability at a lowest frequency of interest and maximized transparency at a highest frequency of interest for respective tuning settings.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the full range of equivalents of the claims.

What is claimed is:

1. A tunable network, comprising:
   two inductors connected in series;
   a shunt capacitor coupled between a series connection of the two inductors and a ground; and
   at least one tunable capacitor, in parallel with the two inductors, wherein the at least one tunable capacitor tunes a self-resonant frequency and a reactive impedance of the two inductors.

2. A tunable network comprising the network of claim 1, wherein the tunable network is a bypassed-double pi network.

3. The tunable network of claim 2, wherein the at least one tunable capacitor comprises a single variable capacitor in parallel with the two inductors.

4. The tunable network of claim 1, wherein a capacitive allocation to the at least one tunable capacitor and an inductance of the two inductors are selected such that the tunable network has maximized tunability at a lowest frequency of interest and maximized transparency at a highest frequency of interest for respective tuning settings.

5. The tunable network of claim 1, wherein the tunable network is used in a cellular telephone system.

6. The tunable network of claim 1, wherein one or both of the two inductors is a switched inductor.

7. The tunable network of claim 1, wherein the shunt capacitor is tunable.

8. A tunable matching network, comprising:
   a first inductor coupled to a first port and a first node;
   a second inductor, coupled between the first node and a second node;
   a first capacitor, coupled between the first node and a ground node;
   a second capacitor, coupled between the second node and the ground node;
   a third inductor, coupled between the second node and a third node;
   a third capacitor, coupled between the third node and the ground node;
   a fourth inductor, coupled between the third node and a second port; and
   a fourth capacitor, coupled in parallel with the second inductor and the third inductor between the first node and the third node, wherein the fourth capacitor is a variable capacitor, wherein the fourth capacitor tunes a self-resonant frequency of the series combination of the second and third inductors.

9. The tunable matching network of claim 8, wherein at least the first inductor is a variable inductor.

10. The tunable matching network of claim 8, wherein the tunable matching network is used in a cellular telephone system.

11. The tunable matching network of claim 10, wherein a capacitive allocation to the fourth capacitor and an inductance of the second inductor and the third inductor are selected such that the tunable network has maximized tunability at a lowest frequency of interest and maximized transparency at a highest frequency of interest for respective tuning settings.

12. The tunable matching network of claim 8, wherein one or more of the first inductor, the second inductor, the third inductor, or the fourth inductor is a switched inductor.

13. The tunable matching network of claim 8, wherein one or more of the first capacitor, the second capacitor, or the third capacitor is tunable.

14. A tunable network, comprising:
   a first inductor, a second inductor, a third inductor, and a fourth inductor, wherein the first inductor, second inductor, third inductor, and fourth inductor are connected in series;
   a first capacitor, coupled between a series connection of the first inductor and the second inductor and a ground;
   a second capacitor, coupled between a series connection of the second inductor and the third inductor and the ground;
   a third capacitor, in parallel with the second inductor, wherein the third capacitor tunes a self-resonant frequency of the second inductor;
   a fourth capacitor coupled between a series connection of the third inductor and the fourth inductor and the ground;
   a fifth capacitor coupled in parallel with the third inductor, wherein the fifth capacitor tunes a self-resonant frequency of the third inductor; and
   a sixth capacitor coupled in parallel with the third capacitor and the fifth capacitor.

15. The tunable network of claim 14, wherein a capacitive allocation to the sixth capacitor and an inductance of the second inductor and the third inductor are selected such that the tunable network has maximized tunability at a lowest frequency of interest and maximized transparency at a highest frequency of interest for respective tuning settings.

16. The tunable network of claim 14, wherein one or more of the first inductor, the second inductor, the third inductor, or the fourth inductor is a switched inductor.

17. The tunable network of claim 14, wherein one or more of the first capacitor, the second capacitor, the third capacitor, the fourth capacitor, the fifth capacitor, or the sixth capacitor is tunable.

18. A tunable network comprising;
a first inductor, a second inductor, a third inductor, and a fourth inductor, wherein the first inductor, second inductor, third inductor, and fourth inductor are connected in series;
a first capacitor, coupled between a series connection of the first inductor and the second inductor and a ground;
a second capacitor, coupled between a series connection of the second inductor and the third inductor and the ground;
a third capacitor, in parallel with a combination of the second inductor and the third inductor, wherein the third capacitor tunes a self-resonant frequency of the second inductor and the third inductor; and
a fourth capacitor coupled between a series connection of the third inductor and the fourth inductor and the ground.

19. The tunable network of claim 18, wherein one or more of the first inductor, the second inductor, the third inductor, or the fourth inductor is a switched inductor.

20. The tunable network of claim 18, wherein one or more of the first capacitor, the second capacitor, the third capacitor, or the fourth capacitor is tunable.

21. The tunable network of claim 18, wherein a capacitive allocation to the third capacitor and an inductance of the second inductor and the third inductor are selected such that the tunable network has maximized tunability at a lowest frequency of interest and maximized transparency at a highest frequency of interest for respective tuning settings.

* * * * *